US012654414B2

(12) United States Patent
Oetzel

(10) Patent No.: US 12,654,414 B2
(45) Date of Patent: Jun. 16, 2026

(54) SINTERING DEVICE AND METHOD

(71) Applicant: PINK GmbH Thermosysteme,
Wertheim (DE)

(72) Inventor: Christoph Oetzel, Wertheim (DE)

(73) Assignee: PINK GmbH Thermosysteme,
Wertheim (DE)

( * ) Notice: Subject to any disclaimer, the term of this
patent is extended or adjusted under 35
U.S.C. 154(b) by 53 days.

(21) Appl. No.: 19/103,730

(22) PCT Filed: Aug. 24, 2023

(86) PCT No.: PCT/EP2023/073214
§ 371 (c)(1),
(2) Date: Feb. 13, 2025

(87) PCT Pub. No.: WO2024/042155
PCT Pub. Date: Feb. 29, 2024

(65) Prior Publication Data
US 2025/0256476 A1      Aug. 14, 2025

(30) Foreign Application Priority Data

Aug. 25, 2022   (DE) .......................... 102022121487.7
May 30, 2023   (DE) .......................... 102023114065.5

(51) Int. Cl.
B30B 15/34         (2006.01)
H01L 23/00         (2006.01)

(52) U.S. Cl.
CPC .............. B30B 15/34 (2013.01); H01L 24/75
(2013.01); H01L 24/95 (2013.01);
(Continued)

(58) Field of Classification Search
CPC ......... B30B 15/34; H01L 24/75; H01L 24/95;
H01L 2224/75251; H01L 2224/75252;
(Continued)

(56) References Cited

U.S. PATENT DOCUMENTS 8,999,758 B2 *    4/2015   Bayerer .................. H01L 24/83
438/119
11,820,095 B2 *   11/2023   Schivalocchi .......... H01L 24/75
2022/0001637 A1    1/2022   Schivalocchi

FOREIGN PATENT DOCUMENTS

DE         102019204683 A1    8/2020
WO           2013046991 A1    4/2013

* cited by examiner

*Primary Examiner* — Ryan J. Walters
(74) *Attorney, Agent, or Firm* — Dinsmore & Shohl LLP

(57)            ABSTRACT

The invention relates to a sintering device (10) and to a
sintering method for simultaneously connecting component
parts of several electronic assemblies (22) arranged adjacent
to one another by means of pressure sintering, with an upper
tool (12) and a lower tool (14), comprising several first press
plungers (16) assignable to the upper tool (12), and at least
one, in particular several second press plungers (18)
assigned to the lower tool (14), between which the assem-
blies (22) are received. Each of the first press plungers (16)
and/or each of the at least one second press plungers is (18)
assigned a respective drive device (28, 28.1, 28.2) config-
ured to exert a press force on one of the assemblies (22) by
an axial movement of the assigned first press plunger (16)
and/or of the assigned second press plunger (18) along an
effective direction of the press force (P).

In accordance with the invention, it is proposed that the first
press plungers (16) are placed onto the assemblies (22)
before the start of the pressing operation and press the
assemblies (22) against the at least one second press plunger
(18) during the application of the press force.

13 Claims, 8 Drawing Sheets

(52) U.S. Cl.
 CPC ............... *H01L 2224/75251* (2013.01); *H01L 2224/75252* (2013.01); *H01L 2224/7555* (2013.01); *H01L 2224/8384* (2013.01)

(58) Field of Classification Search
 CPC ..... H01L 2224/7555; H01L 2224/8384; H01L 21/67121
 See application file for complete search history.

SINTERING DEVICE AND METHOD

CROSS REFERENCES TO RELATED APPLICATIONS

This application is a U.S. National Phase of International Application No. PCT/EP2023/073214, entitled "SINTERING DEVICE AND METHOD" and filed Aug. 24, 2023, which claims benefit of priority to German Patent Application No. 10 2022 121 487.7 filed Aug. 25, 2022, and German Patent Application No. 10 2023 114 065.5, filed May 30, 2023, the entire contents of each are incorporated herein by reference in their respective entireties.

The present invention relates to a sintering device and to a method for simultaneously connecting component parts of several electronic assemblies arranged adjacently to one another by means of pressure sintering.

PRIOR ART

It is possible in pressure sintering for two or more component parts, in particular electronic components and substrates, to be connected to one another in an electrically and/or thermally conductive manner by means of a joining material, wherein the connecting joining material is sintered. The component parts to be connected are pressed uniaxially between an upper tool and a lower tool in order to provide a joining pressure.

It has become clear that making a connection in a process atmosphere, in particular in a negative pressure or vacuum, is particularly advantageous, in particular for preventing unwanted chemical reactions such as oxidation, for preventing gas cavities and for preventing contamination. Heat needed for sintering is as a rule transmitted to the component parts via the upper tool and the lower tool, but may also be applied as radiant heat from the lower and/or upper side. Several components, which may differ from one another in respect of both their lateral extent and their height, often have to be arranged on a common substrate. To ensure a uniform pressure transmission, several press plungers may be provided on the upper tool and/or lower tool that are matched in their dimensions to the component parts to be connected.

If various assemblies of differing type are to be processed on a facility, regular adjustment of the press plunger arrangement on the upper or lower tool is required. The adjustment is time-consuming and made more difficult by the fact that the tools and/or press plungers may be hot. Also, the tools, in particular the press plungers, are usually made of metal, since they have to withstand high pressure forces. Such tools are therefore heavy, slow to cool down and cost-intensive. Furthermore, an exact positional alignment of the tools/press plungers relative to the component parts to be connected is required.

An object of the present invention is to provide a sintering device and a corresponding method permitting a rapid and dependable adjustment of a press plunger arrangement to the component parts to be connected.

DISCLOSURE OF THE INVENTION

The object is achieved by a sintering device having the features of claim 1 and by a method having the features of the independent claims. Preferred embodiments are stated in the sub-claims.

A sintering device in accordance with the invention, for simultaneously connecting component parts of several electronic assemblies arranged adjacent to one another by means of pressure sintering, comprises an upper tool and a lower tool, wherein several first press plungers are assignable to the upper tool (12), and at least one and in particular several second press plungers are assigned to the lower tool. The assemblies are held between the first press plungers and the at least one and in particular several second press plungers, wherein each of the first press plungers and/or each of the at least one second press plungers is assigned a drive device configured to exert a press force on one of the assemblies by an axial movement of the assigned first press plunger and/or of the assigned second press plunger along an effective direction of the press force (P). It is proposed that the first press plungers are placed onto the assemblies before the start of the pressing operation, i.e. are also placed outside the sintering device before the sintering operation, and press the assemblies against the at least one second press plunger during the application of the press force.

In contrast to conventional sintering devices, in which the press plungers acting on an upper side of the assemblies are fastened permanently or interchangeably to an upper tool, the first press plungers acting on the upper side of the assemblies are only placed loosely onto the assemblies or their component parts. The placing of the first press plungers onto the assemblies is performed preferably outside the sintering device, so that during a step, required in any case, of insertion of the component parts into the sintering device the first press plungers can be inserted jointly with the component parts. When the drive device(s) move(s) the second press plunger(s) in order to exert the press force, the first press plungers are pressed, together with the component parts underneath the assemblies, against the pressure plate arranged above the assemblies, said pressure plate being stationary, for example fastened to a frame of the sintering device, or are pressed relative to respective drive devices of the upper tool. Alternatively, the second press plunger(s) may be supported on a pressure plate of the lower tool, and the first press plungers of the upper tool press the assemblies against the pressure plate, or the second press plungers of the lower tool. The pressure plate or the drive device respectively opposite to it thus applies a counterforce opposing the press force. The pressure plate or the drive device, preferably of the lower tool and/or upper tool, is preferably temperature-adjustable by means of corresponding heating and/or cooling devices, in order to effect a heat transfer to or from the component parts through the first and/or second press plungers. Preferably, the heating and/or cooling device is provided at least in the lower tool, in order to heat up a basic body of the assembly, while the first press plungers of the upper tool are thermally heated up beforehand, e.g. before or after being placed, so that a separate heating or cooling device in the upper tool may be dispensed with.

Alternatively or additionally to placing of the first press plungers onto the assemblies before the start of the sintering operation, it is possible, as described in EP 4 080 554 A2, to fasten at least some of the first press plungers, in particular all the first press plungers, inside the upper tool in interchangeable manner, in particular thermally clamped in a clamping device. This permits a flexible configuration of the first press plungers. It is for example possible for the first press plungers to be received in the upper tool on or in a holding plate of the upper tool in movable manner along an effective direction of the press force at a first temperature, and to be clamped on or in the holding plate or upper tool at a second temperature which is higher than the first temperature. This permits in particular a rapid and precise adjustment to respective assemblies in which the various component parts differ in height. For example, in this way the first press plungers at the first, i.e. low temperature may be moved near enough to the assemblies to be connected, or to a corresponding alignment gage until all contact surfaces of the first press plungers are in contact with respectively assigned components. Those press plungers which are in contact with relatively tall component parts or components are moved further than those press plungers which are in contact with component parts or components of comparatively low height. When the press plungers have adjusted to the components or to the assemblies with respect to their longitudinal position, a temperature of the first press plungers and of the holding plate of the upper tool is increased. As a result, the first press plungers are clamped on or in the holding plate and hence fixed with respect to their longitudinal or axial position. Clamping creates a non-positive connection between the first press plungers and the holding plate.

Advantageously, a definable temperature gradient between the upper plunger and the lower plunger is providable during the sintering operation due to the separately operatable heating or cooling devices in the lower tool and upper tool, in particular in the associated press plungers. As a rule, a heat-sensitive upper part of the assembly, e.g. a power semiconductor component, faces the upper tool, while a heat-insensitive and advantageously highly thermally conductive lower part of the assembly, for example a heat sink, faces the lower tool. A sintered joint is to be created between the underside of the upper part and the lower part of the assembly, as a rule when a sintering paste intermediate layer is provided. In order not to exceed a limit temperature of the upper part, the upper plunger may be heated or cooled during the sintering operation along a temperature curve with lower temperature curves compared to a temperature curve with higher temperatures of the upper plunger. For example, a temperature gradient from 50° C. to 100° C. can be set between the hotter lower second press plungers and the cooler upper first press plungers at least when the sintering temperature is reached.

If a single drive device is used in the upper tool and/or in the lower tool, it may for example be designed as a single-acting hydraulic cylinder for the respectively assigned single or several first and/or second press plungers. The single-acting hydraulic cylinder may have a large piston surface that can substantially cover the surface for arranging the assemblies on the carrier frame. The single-acting hydraulic cylinder may be reset for example using a spring means or using another resetting element. To that extent, acting on one pressing plane by hydraulic tension and using an expensive double-acting hydraulic cylinder may be dispensed with, and instead the single-acting hydraulic cylinder may move freely as a cylinder block so that the hydraulic pressing device is providable inexpensively and places low requirements on the hydraulic control.

In one advantageous embodiment, the first press plungers may be braced against a pressure plate of the upper tool, wherein the at least one drive device of the lower tool, in particular a respective drive device assigned to each second press plunger, applies the press force P in an effective direction via the at least one second press plunger in the direction of the upper tool. Alternatively, the at least one second press plunger may be braced against a pressure plate of the lower tool or be formed from said plate, wherein the at least one drive device of the upper tool, in particular a respective drive device assigned to each first press plunger, applies the press force P in the effective direction of the lower tool. In this embodiment, at least one drive device may be arranged either in the upper tool or in the lower tool for application of a press force in the effective direction of the lower tool or of the upper tool. If at least one drive device is provided in the upper tool, the press force may be transmitted for example via a pressure plate to the first press plungers in the effective direction of the lower tool. Alternatively, respective drive devices (multi-drives) separately assigned to each of the first press plungers may be arranged in the upper tool and individually exert press forces on the first press plungers. In this case, the second press plunger may be designed for example as a pressure plate in the lower tool. Alternatively, a plurality of second press plungers statically fixed in the lower tool may brace the assemblies against the lower tool. Alternatively, at least one drive device may be provided in the lower plunger. This device may for example move the second press plunger, designed as a pressure plate, or several second press plungers, statically connected to the drive device, in the effective direction of the press force towards the upper plunger. However, each of the several second press plungers, in particular each second press plunger assigned to a first press plunger, may also have a separately assigned respective drive device (multi-drive) arranged in the lower tool which can exert individual press forces on the second press plungers. To that extent, this embodiment provides a common drive device or multi-drives for the first or second press plungers either in the upper tool or in the lower tool.

Alternatively to the aforementioned embodiment, a respective drive device of the upper tool may be assigned to the several first press plungers and a drive device of the lower tool to the several second press plungers in an advantageous further embodiment, wherein each electronic assembly is subjectable on both sides to the drive devices of the upper tool and of the lower tool due to opposing effective directions of the press forces P. In this embodiment, a sandwich-like opposing pressing of the assemblies by at least one drive device of the upper tool and of the lower tool is proposed. The drive device of the upper tool may, as a single drive, for example distribute press forces onto the first press plungers placed on the assemblies via a pressure plate. Alternatively, a respective drive device may be provided separately assigned for each first press plunger. The same applies for the drive device of the lower tool. This device may be provided as an single drive device that applies a press force in the effective direction of the upper tool, for example via a second press plunger designed as a pressure plate or via several second press plungers statically arranged on the drive device. Alternatively, a respective drive device may be provided separately assigned for each second press plunger. In contrast to the aforementioned embodiment, it is possible by a mutual pressing of the assemblies by oppositely operating drive devices in the upper tool and the lower tool to achieve individual temperature and pressure parameters on adjacently arranged assemblies, which is advantageous in particular for parallel sintering of different types of assemblies.

According to a preferred embodiment, each drive device is controllable individually in respect of a movement distance and/or an exerted press force, preferably hydraulically, by electric motor, piezoelectrically or magnetostrictively. Preferably, a respective first and/or second press plunger is assigned to a respective assembly or component part. This makes it possible to subject the various assemblies or individual component parts to a uniform pressure. It is in particular ensured that each assembly can be individually subjected to a predefined pressure. This also prevents individual assemblies being subjected to a too high or too low pressure, as is the case for example with conventional solutions in which several assemblies are subjected to only a single common press plunger. A further advantage is that height tolerances of the assemblies or component parts can be equalized or taken into account. The necessary press force may be set for example with the aid of an assigned force or pressure transducer or also of a movement transducer, wherein the exerted press force may be achieved directly by setting a working pressure or indirectly by setting a movement distance of the second press plungers. A hydraulically controllable drive device may be formed, for example by an arrangement of double-acting pistons which may be supplied from a common pressurized fluid reservoir by means of corresponding control valves. As a general principle, each drive device may however also have its own fluid source for pressure generation, allowing valves to be dispensed with. An electric motor-type control may be achieved for example with the aid of a drive device having a spindle drive. Furthermore, piezoelectrically or magnetostrictively operated drive devices may also be provided.

According to a further preferred embodiment of the invention, each of the first and/or second press plungers is connected to the assigned drive device. Advantageously, the second press plungers are not put into place, but form a unit with the assigned drive device.

Alternatively or additionally, each of the first and/or second press plungers may have a respective heating and/or cooling device. By means of the heating/cooling device, an individually controllable heat transfer to or from this assembly may be achieved individually for each second press plunger and hence for each assembly which is in thermal contact with it. The heating and/or cooling device may be for example electrically operated and/or comprise respective fluid ducts provided in the second press plungers which are fluidically connected to a corresponding temperature-adjustable fluid source. Preferably, the heating and/or cooling device is designed as a pin-contact heating and/or cooling device. Due to highly thermally conductive elastic pins, a heating or cooling temperature can be efficiently transmitted, and in particular any alignment problems such as equalization of the parallelism of the surfaces can be compensated for even before the second press plungers make full-surface contact with the assemblies. Thermo-transfer pin contacts of this type are described for example in WO 2016/091962 A1. They can already be used in a heating chamber for heating up the assembly, the second press plungers and/or the pressure plate. Preferably, the temperatures of the first and second press plungers are regulated simultaneously and in conformity with a predefinable temperature gradient between a respective first press plunger and assigned second press plungers in combined temperature control for the heating and/or cooling device. As a result, temperature-sensitive parts of the assemblies can be protected from thermal overloading. Furthermore, identical temperature conditions at first and second press plungers can be maintained even after a plurality of recurring sintering operations.

According to a further preferred embodiment, a carrier frame insertable into the sintering device is provided, in which the component parts of the assemblies, preferably together with the placed first press plungers, are held in guided manner in the lateral direction, wherein the carrier frame preferably has penetrations, assigned to the assemblies, through which the second press plungers can come into mechanical and thermal contact with the assemblies. The assemblies are mounted laterally aligned by the carrier frame to match an arrangement pattern of the second press plungers, wherein the lateral alignment relates to an alignment transverse to the pressing direction. While the carrier frame therefore prevents any lateral movement of the component parts, a movement along an effective direction of the press force is enabled. The penetrations enable the second press plungers to lift the component parts out of the carrier frame.

Preferably, the carrier frame has a higher thermal expansion coefficient than an upper part of the assemblies. The assembly to be sintered may consist of individual and stacked parts, for example power semiconductor components as the upper part and heat sinks as the lower part of the assembly, that may differ in their thermal expansion. A power semiconductor component thus has a lower thermal expansion than a heat sink. During heating up to sintering temperature, an unwanted displacement of the stacked assemblies relative to one another may occur. Since an exact and positionally correct alignment of the individual stacked parts of the assembly to one another is important in the further processing step, the carrier frame may advantageously have a thermal expansion that compensates for the unwanted thermal relative displacement of the assembly parts to one another and for example thermally moves the upper parts in the same way relative to the lower part(s). Advantageously, the carrier frame may have a higher thermal expansion than the upper parts of the assemblies received therein, and may in particular consist of aluminium. It is thus possible, for example in subsequent process steps, for an electrical power supply board to be connected to connecting contacts of the power semiconductor components, sintered on a common heat sink or on individual heat sinks, preferably converter components such as IGBTs for an electrical energy conversion.

According to a further preferred embodiment, at least one guide frame is preferably detachably arranged on the carrier frame, and is configured to guide the first press plungers in the lateral direction relative to the assemblies. The guide frame thus prevents a relative movement of the placed press plungers relative to the component parts of the assemblies and/or to the carrier frame. In order to facilitate the filling of the carrier frame, or a reconfiguration for differing assembly and/or plunger configurations, the at least one guide frame may be fitted onto the carrier frame or also bolted thereto. For example, the guide frames may be arranged in the carrier frames only after completed insertion of the component parts, whereupon the first press plungers can then be placed into the guide frame.

According to a further preferred embodiment, each of the first and/or second press plungers has a plunger element, axially movable along an effective direction of the press force, and a contact surface contactable with a component part of the assembly, wherein the contact surface is mounted tiltably about at least one spatial axis relative to the plunger element. However, the contact surface is preferably tiltable about two Cartesian spatial axes, wherein the third spatial axis of this Cartesian spatial axis system extends along the effective direction of the press force. The contact surface is thus in effect cardanically movably relative to the plunger element, so that the contact surface can make a uniform surface contact with the component part which is touching it. Unlike with a rigidly aligned contact surface, therefore, which in some circumstances may be tilted relative to the component part contacted by it, the occurrence of power peaks or power gradients within the component parts is avoided and the press force is evenly distributed. The contact surface is here self-aligning. The tiltable mounting of the contact surface relative to the plunger element may be effected for example by an elastic equalizing layer. A respective press plunger may for example also be in two parts, and comprise besides the said plunger element a further plunger element which has the contact surface as mentioned, wherein both parts of the plunger elements are connected via the said elastic equalizing layer, or another mounting that permits tilting is provided.

According to a further preferred embodiment, several first press plungers arranged adjacent to another are assigned to a respective second press plunger. Alternatively, several second press plungers arranged adjacent to another may be assigned to a respective first press plunger. In particular, the first/second press plungers assigned to a second/first press plunger respectively may have differing heights. This allows also those assemblies to be sintered where for example several components of differing height are to be arranged on a flat substrate. The height of the first/second press plungers is dimensioned such that the contact surfaces facing the pressure plate, of the first/second press plungers are in a common plane.

Advantageously, the first press plungers may, in the framework of flow production, be transported by a transport device, in particular bypassing the sintering device after conclusion of the sintering operation, from an unloading station downstream of the sintering device back to a loading station upstream of the sintering device, as described for example in WO 2021/069328 A1. Hence a serial production process is assured that can sinter a large number of components to be connected at high cycle rates.

A method in accordance with the invention for simultaneously connecting component parts of several electronic assemblies arranged adjacent to one another by means of pressure sintering in a sintering device, which is designed in particular according to any of the preceding embodiments preferred or in accordance with the invention, wherein the sintering device comprises several first press plungers and at least one, in particular several second press plungers, between which the assemblies are received, and wherein each of the first press plungers and/or the at least second press plunger is movable for exerting a press force onto one of the assemblies by means of an assigned drive device axially along an effective direction of the press force, comprises the steps Placing the first press plungers onto the assemblies, Inserting the assemblies together with the first press plungers into the sintering device, into a position aligned with the second press plungers, and Performing the sintering operation by means of actuating the drive device, in order to move the first press plungers and/or the at least second press plunger, to generate the pressure, from a rest position into a working position in which the assemblies are together pressed between the first press plungers and the at least second press plunger which is arranged opposite the first press plungers for application of a counterforce.

By placing the first press plungers onto the assemblies and jointly inserting the assemblies into the sintering device, the first press plungers can be configured in simple manner which comprises both the arrangement of first press plungers of suitable size and also their exact alignment relative to the assemblies, and/or indirectly also to the arrangement geometry of the second press plunger(s).

The insertion of assemblies together with the first press plungers into the sintering device may be advantageously achieved with the aid of a carrier frame, in which the component parts of the assemblies together with the placed press plunger are held in guided manner in the lateral direction. The carrier frame may have penetrations, preferably assigned to the assemblies, through which the second press plungers can come into mechanical and thermal contact with the assemblies. The assemblies may be lifted out of the carrier frame during movement of the second press plunger(s) into the working position. To prevent the first plungers from slipping sideways or laterally during lifting out, before they come into contact with the pressure plate and are fixed by the press force that is building up, the carrier frame may have a guide frame which is configured to guide the first press plungers in the lateral direction relative to the assemblies. The guide frame ensures an axial displaceability of the first press plungers in the effective direction of the press force.

Advantageously, the guide frame and/or the carrier frame has complementary aligning elements, such as guide pins, guide grooves, guide recesses or the like, which provide a positionally correct arrangement of the guide frame on the carrier frame. When filling the carrier frame with the assemblies, it is for example possible to place, onto or into the carrier frame, a lower part of the assemblies, for example a heat sink, which can also act as a lower part for several placed upper parts of the assembly. The guide frame can then be placed onto the carrier frame with its position aligned by aligning elements. The guide frame may have penetrations into which an upper part of the assemblies, for example power semiconductor components, are inserted with placed first press plungers.

According to a preferred embodiment of the method, at least the step of performing the sintering operation comprises heating and/or cooling of the first press plunger and/or of the at least one, in particular several, second press plunger(s). As a result, the heat required for sintering may be transmitted via the press plungers to the assemblies and if necessary selective cooling may take place additionally. For protection against exceeding a critical temperature of an upper part of the assembly, for example of a power semiconductor component, the first, upper press plunger may preferably maintain during the sintering operation a lower temperature level than the second lower press plunger, which for example is facing a heat sink. A thermal transfer may take place preferably via an elastic thermal transfer device, as known from WO 2016/091962 A1. Preferably, the second press plunger(s) is/are heated or cooled, wherein the first press plungers are preheated before or after being placed onto the assemblies, and maintain a predeterminable temperature level due to their thermal storage capacity. As a result, it may be possible to dispense with a heating and/or cooling device in the upper tool.

According to a further preferred embodiment of the method, the various drive devices for movement of the first and/or second press plungers into the working position are actuated with a time delay. The various drive devices for movement of the first and/or second press plunger(s) from the working position back into the rest position may be actuated in the same time sequence, simultaneously or also in a reversed time sequence.

In accordance with a further advantageous embodiment of the method, the various drive devices are actuated with a time delay such that initially at least one drive device arranged in a central area is actuated and drive devices further outwards are actuated after a time interval. For example, it is possible, with an arrangement of nine press plungers in three rows each of three press plungers, for the middle press plunger to be moved first and following that the press plungers further outwards that surround it. Advantageously, by prior lifting out of the central component or central assemblies, the aforementioned guide frame may also be lifted and all the upper press plungers received therein, or upper parts of the assemblies with upper press plungers, are also lifted and centered before the further peripheral press plungers exert pressure. This enables an early alignment of the assemblies relative to the upper and lower press plungers or to the upper and lower drive devices. Advantageously, the guide frame comprises three groups each of three assemblies, if applicable also four groups each of three assemblies, wherein the middle drive device inside the group lifts the middle assembly out of the carrier frame with upper press plungers and guide frame beforehand.

Preferably, at least the sintering operation takes place in a process atmosphere, in particular in an oxygen-free and oxidation-preventing process atmosphere, preferably at a negative pressure and in particular in a vacuum.

Advantageously, a measuring carrier frame may be provided for calibration and/or verification of the sintering device and of the sintering method, which may also comprise a measuring guide frame and geometrically replicated assemblies arranged in geometric form in the correct position, wherein pressure sensors and/or temperature sensors may be provided in or on the replicated assemblies which are for example initially passed through the sintering device during setting up or calibration of the sintering device and subjected to the intended sintering pressures and sintering temperatures, in order to permit verification and calibration of the sintering method. The data of the pressure and/or temperature sensors may be used for setting process parameters and for testing for correct functioning of the sintering device.

The heating and/or cooling temperature is preferably transmitted by means of mechanical contact cooling. Thermal radiation transmission, for example by means of infrared radiant heaters, or convection temperature transmission by process gas circulation may be used.

DRAWINGS

Further advantages are revealed by the drawing and the associated description of the drawing. The drawing shows examples of the invention. The drawing, description and claims contain numerous features in combination. A person skilled in the art will expediently also consider the features individually and combine them into meaningful further combinations. In particular, the person skilled in the art will also apply features described with relation to embodiments of the sintering device in embodiments of the method in accordance with the invention, and vice versa.

Figure 1:
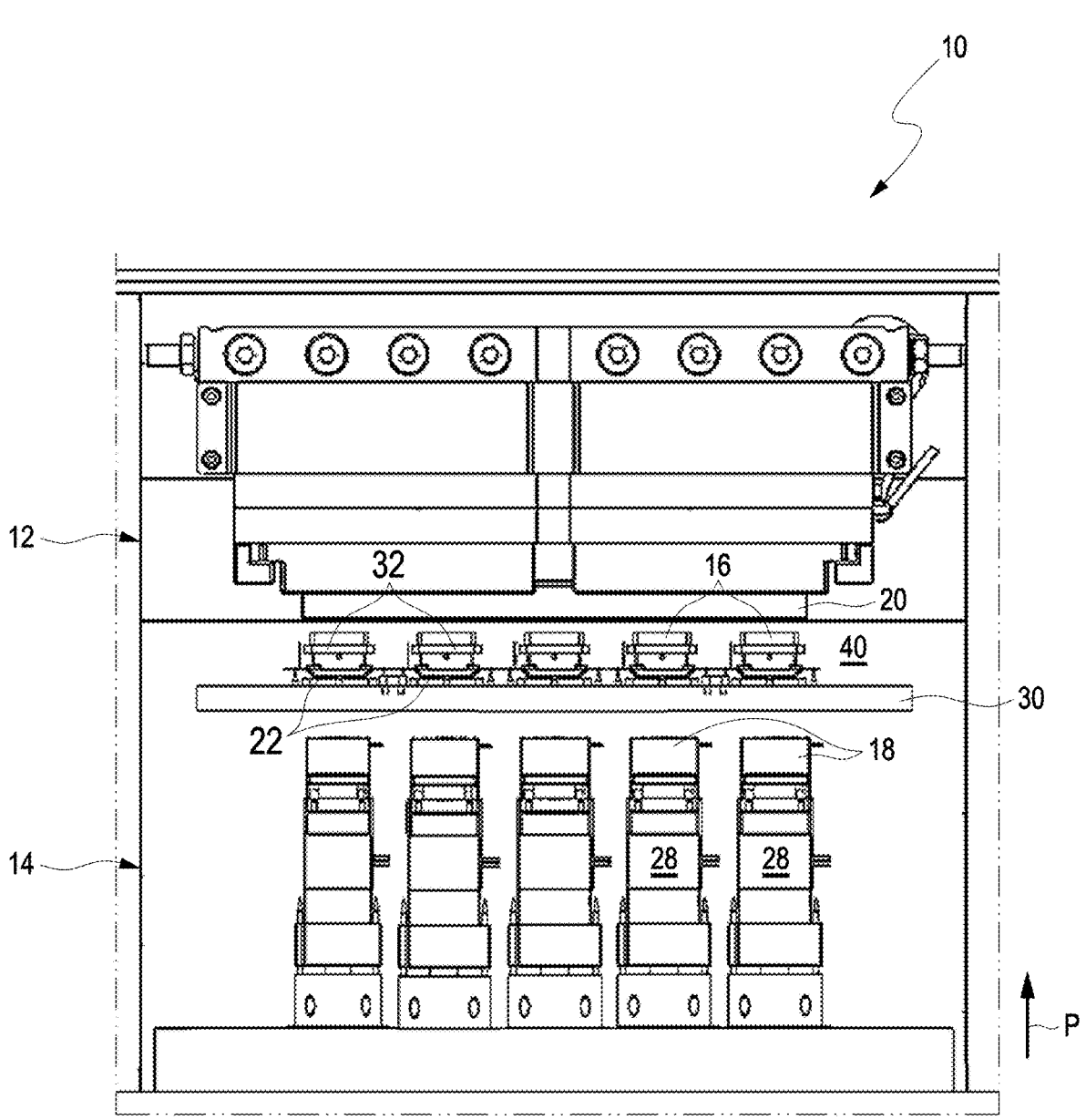
FIG. 1 shows a schematic longitudinal sectional view of a sintering device in accordance with a first example.

FIGS. 1 and 4 to 7 show a sintering device 10 according to a first example, which comprises an upper tool 12 and a lower tool 14. In the first example, a sintering device 10 is considered in which the first press plungers 16 are braced statically against a pressure plate 20 of the upper tool 12 and wherein several second press plungers 18 of the lower tool 14 are each movable by separate drive devices 28, 28.2. The sintering device 10 may comprise a solid press frame, which may border an evacuable process chamber, wherein the upper tool 12 and the lower tool 14 are braced on the press frame.

The upper tool 12 comprises a flat pressure plate 20 which may have a heating and/or cooling device (not shown). The lower tool 14 comprises an arrangement of second press plungers 18, wherein a drive device 28 is assigned to each second press plunger 18. The drive devices 28 may for example each be designed as a hydraulically operated piston/cylinder arrangement which is operated by means of a pressurized hydraulic fluid in order to effect lifting or lowering of the assigned second press plunger 18. The second press plungers 18 may also have heating and/or cooling devices, for example fluid ducts, through which temperature-adjustable fluid flows, or IR-based electrical or inductive heating elements.

A working space 40, into which a carrier frame 30 may be inserted or pushed in and on which the component parts of the assemblies 22 to be connected are mounted, is defined between the second press plungers 18 of the lower tool 14 and the pressure plate 20 of the upper tool 12.

Figure 2:
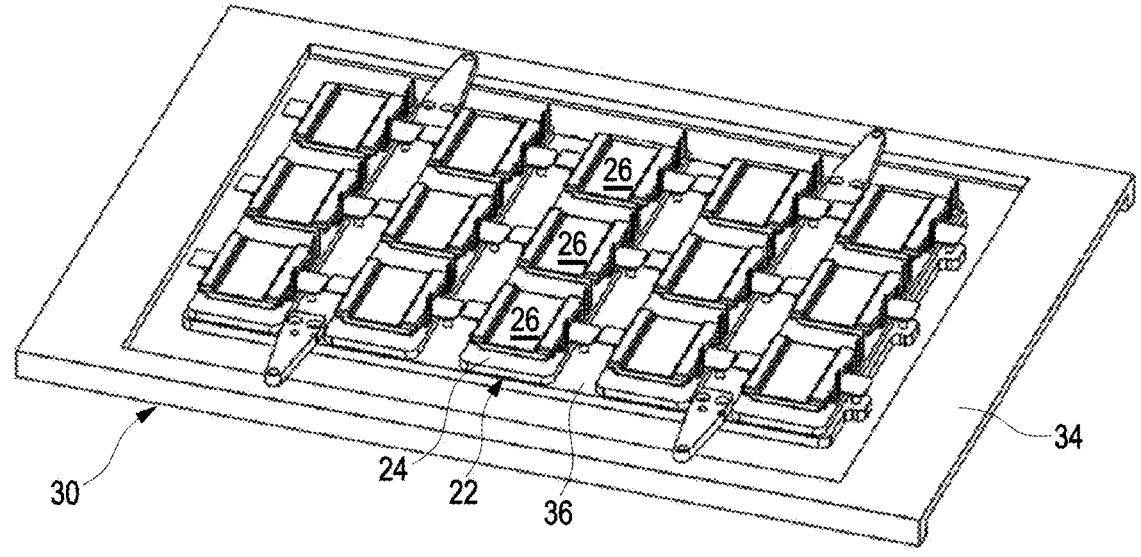
FIG. 2 shows a schematic perspective view onto a carrier frame of the sintering device of FIG. 1 with inserted component parts.
Figure 3:
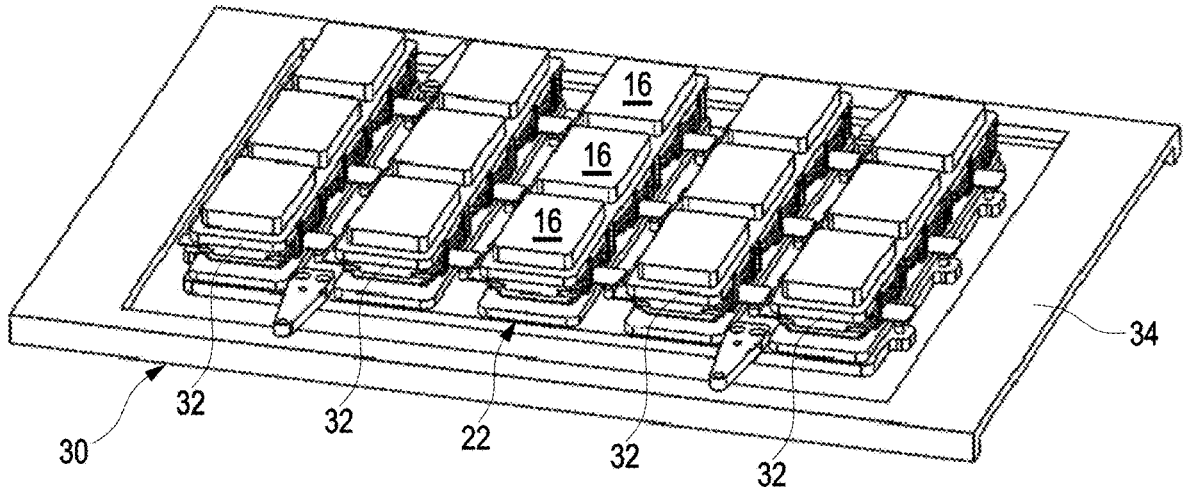
FIG. 3 shows a perspective view of the carrier frame of FIG. 2 additionally with placed first press plungers and guide frame.

The mode of operation of the carrier frame 30 is explained in more detail with reference to FIGS. 2 and 3. The carrier frame 30 comprises an outer frame 34 with a central opening in which an inner frame 36 is arranged. In the example, a total of five substrates 24 are placed into the inner frame 36 and held in laterally guided manner, for example heat sinks or carrier plates for a power semiconductor component on which three components 26 are placed, for example semiconductor units or so-called molds in which several semiconductor components have already been joined together and encapsulated in advance. Respective first press plungers 16 are in turn placed on the components 26, wherein three first press plungers 16 each assigned to a respective substrate 24 are mounted in laterally guided manner in a guide frame 32. Each guide frame 32 accordingly extends over one respective substrate 24.

The carrier frame 30 has openings or penetrations, covered by the substrates 24, through which the second press plungers 18 can pass in direct contact with the assemblies 22 or the substrates 24.

With the sintering device 10 shown in the example, a total of five assemblies 22 may be connected by means of pressure sintering, wherein each assembly 22 comprises a common substrate 24 and three components 26 arranged in a row thereon. Accordingly, the second press plungers 18 including the assigned drive devices 28 are arranged in a matrix with five rows each of three second press plungers 18 or three drive devices 28. The placed first press plungers 16, the components 26, the second press plungers 18 and the drive devices 28 are each aligned with one another, i.e. the said component parts are located in each of the fifteen stacks in a plan view, i.e. arranged vertically one above the other in the effective direction of a press force P.

Filling of the carrier frame 30 with the assemblies 22, the guide frames 32 and the first press plungers 16 takes place preferably outside the sintering device 10. After completion of filling, the carrier frame 30 including the elements arranged thereon is inserted into the sintering device 10. A corresponding rest position is shown in FIG. 1, in which the sintering device 10 is shown in a longitudinal section, so that in total a row with five press plungers 16, 18 and correspondingly also five assemblies 22 and five drive devices 28 are visible. In contrast to this, the sectional views shown in FIGS. 4 to 7 represent cross-sections, so that in each case only one assembly 22 with a substrate 24 and three placed components 26 is visible. Accordingly, only three press plungers 16, 18 and three drive devices 28 are shown here.

Figure 4:
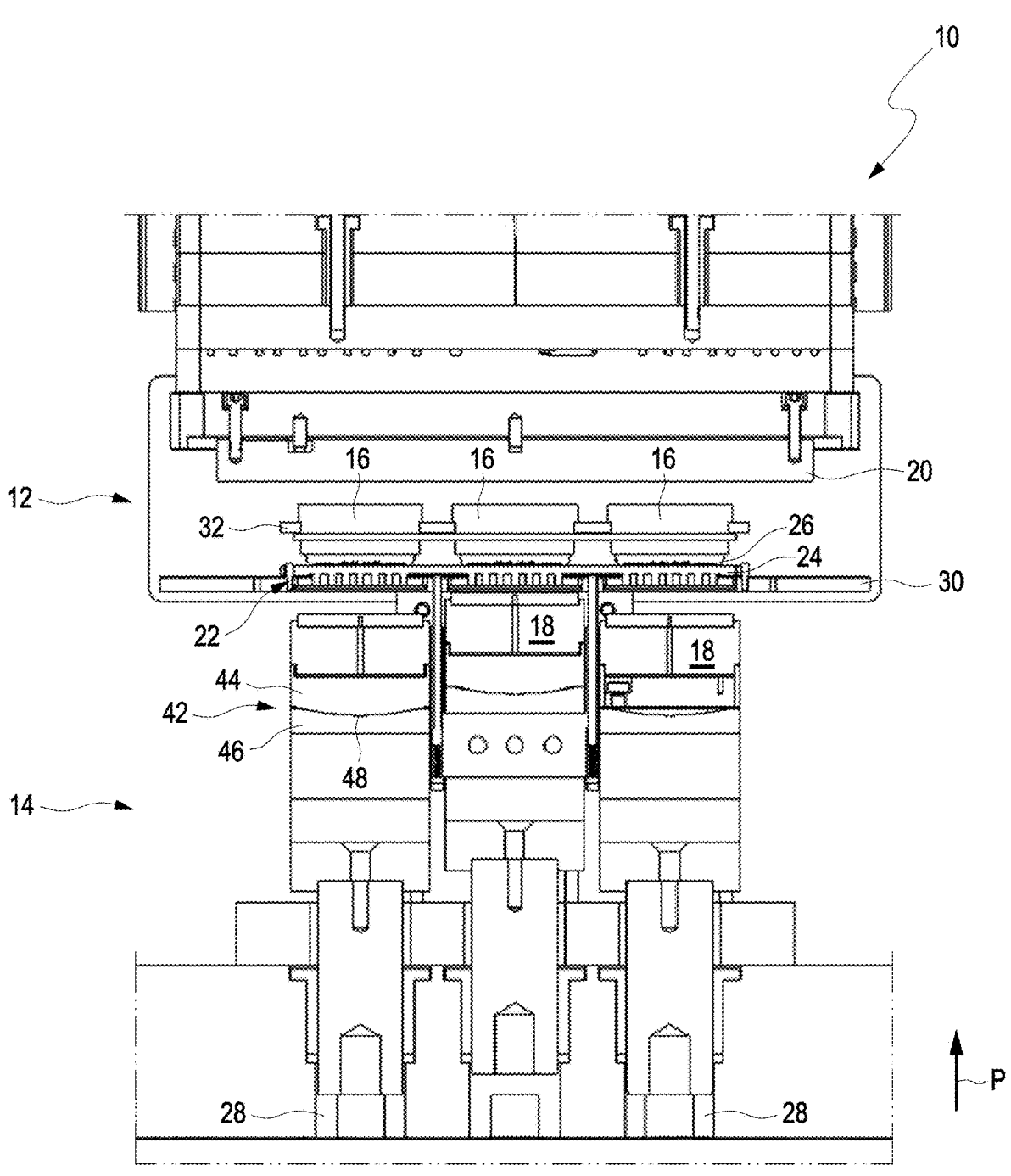
FIGS. 4 to 7 show schematic cross-sectional views of the sintering device of FIG. 1 in different operating positions.
Figure 5:
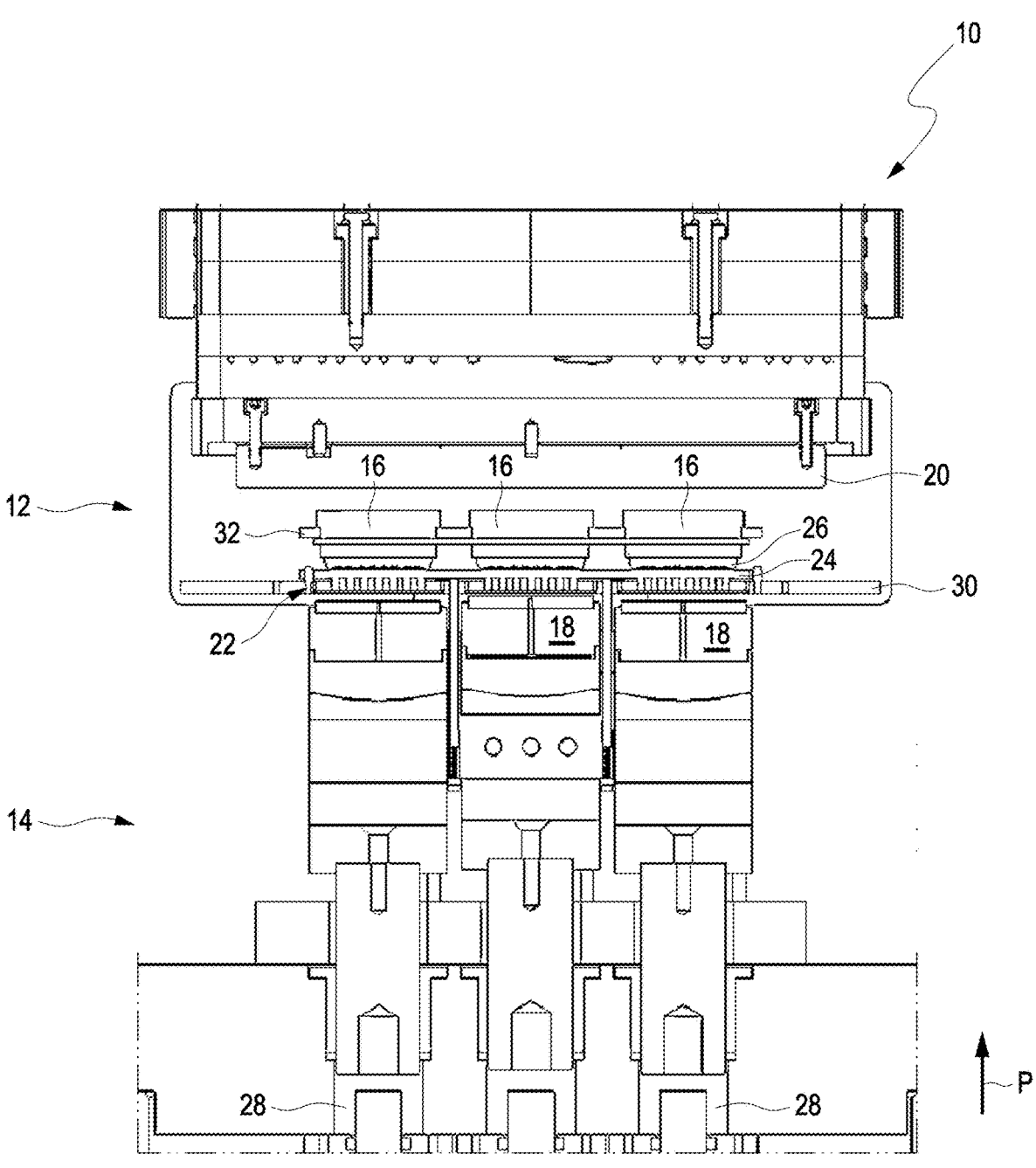

As may be seen in FIG. 4, the second press plungers 18 may have a plunger element 42 in two parts, with an upper plunger element 44 facing the pressure plate 20 and a lower plunger element 46 facing the assigned drive device 28. The contact surface 48 between the upper plunger element 44 and the lower plunger element 48 is designed as a spherical surface and enables the upper plunger element 44 in contact with the assembly 22 on its underside to self-align by a minor sliding movement along the spherical surface. This allows the occurrence of pressure peaks inside the assembly 22 to be avoided.

In accordance with an embodiment of an operational method for operating the sintering device 10, initially only the central second press plungers 18 assigned to a respective assembly 22 are lifted according to FIG. 4. According to FIG. 5, the outer second press plungers 18 are lifted with a time lag, so that a certain height offset may occur temporarily between the upper sides of the second press plungers 18. As soon as the second press plungers 18 come into contact with the underside of a respective substrate 24 of an assembly 22, said assembly 22 is lifted out of the carrier frame 30 in the effective direction of the press force, wherein at the same time the placed first press plungers 16 are lifted out of the assigned guide frame 32.

Figure 6:
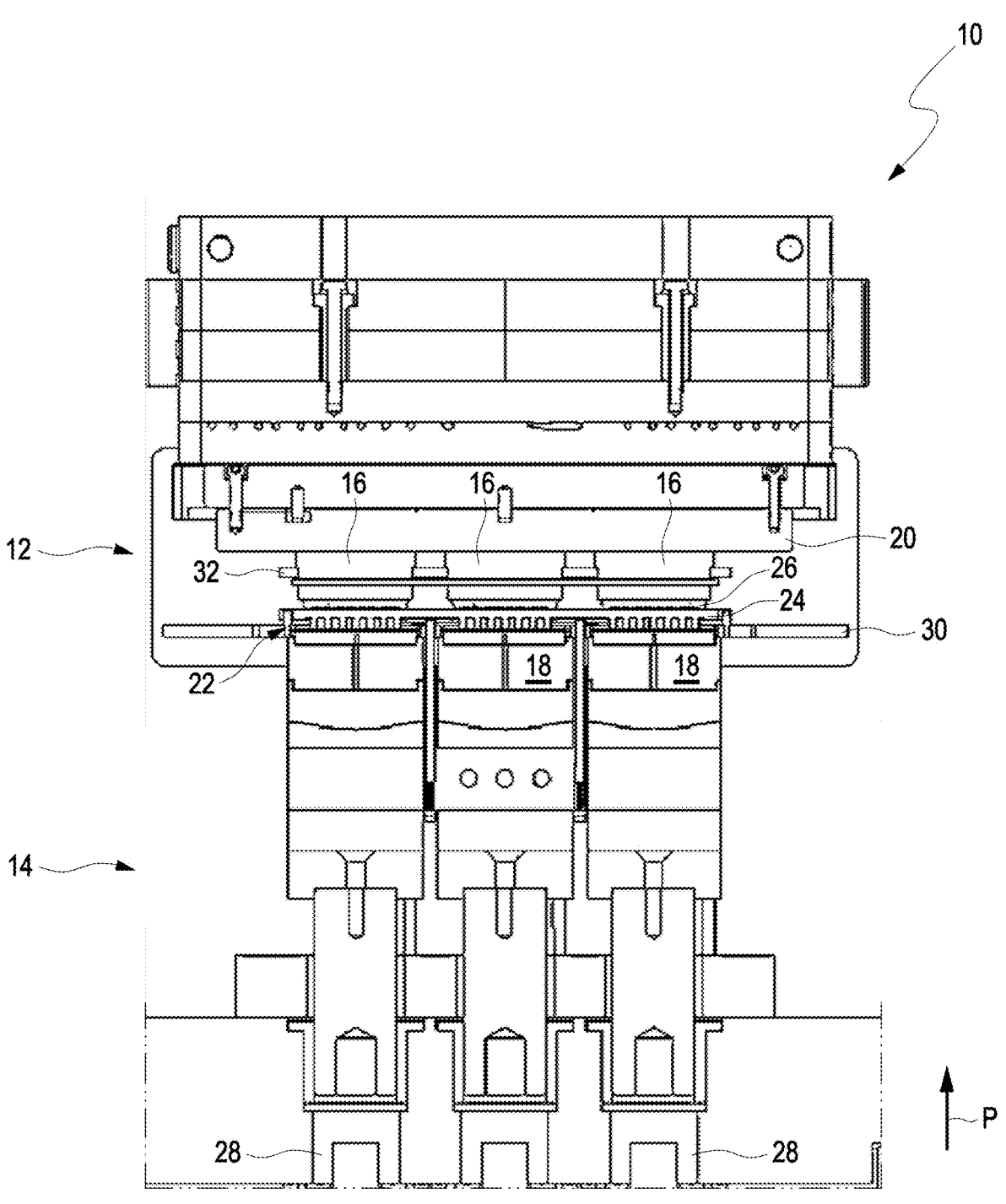

According to FIG. 6, the first press plungers 16 come into contact with the pressure plate 20 as lifting proceeds, wherein a counterforce opposing the press force P generated by the drive devices 28 builds up, so that a pressure increase inside the assemblies 22 results. The heat required for pressure sintering heat is provided by heating of the pressure plate 20 or of the second press plungers 18.

The working position of the sintering device 10 shown in FIG. 6 is maintained for a predefined period until the formation of the sintered joint between the component parts of the assemblies 22 is concluded.

Figure 7:
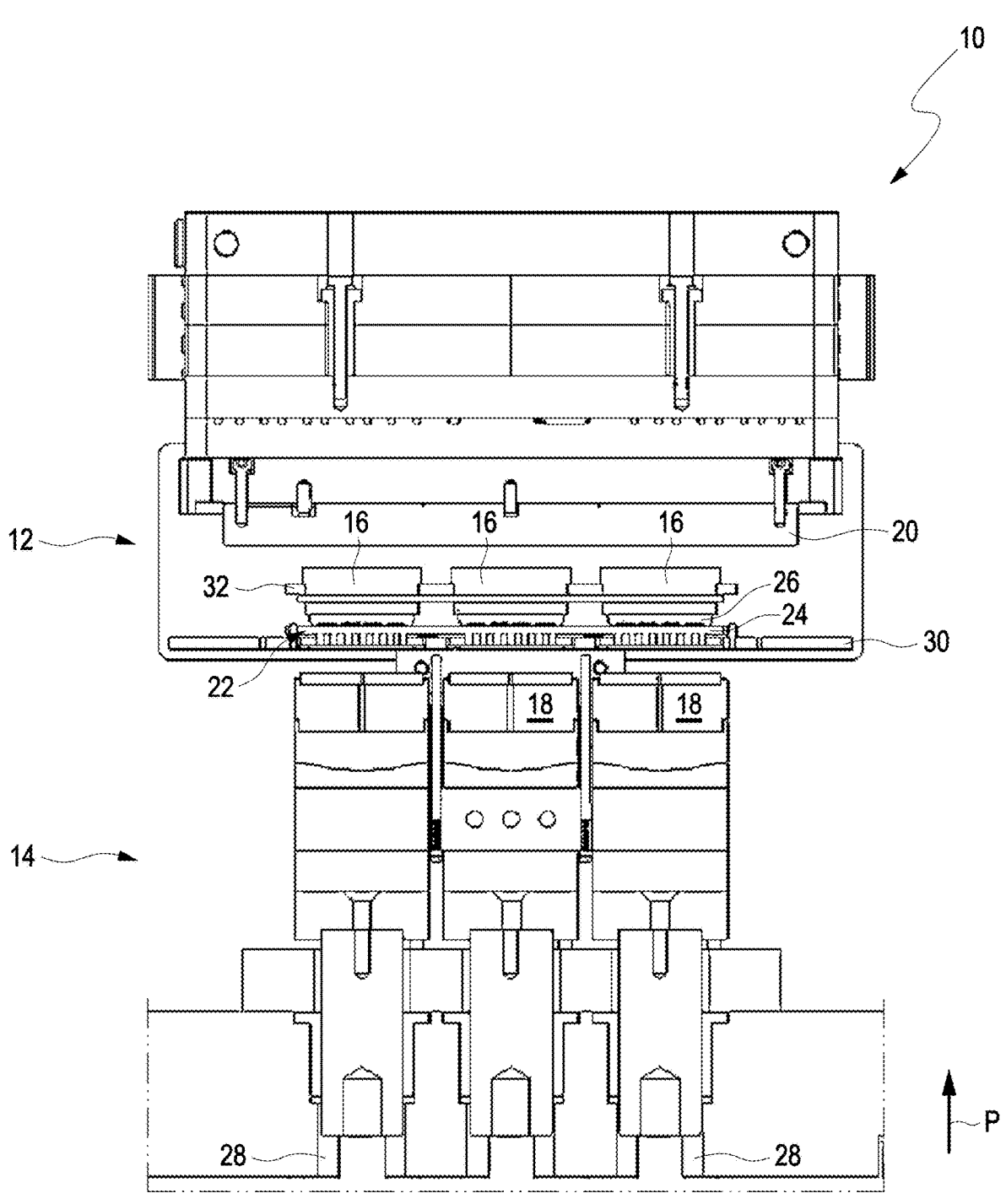

Nach completion of the sintering operation, the drive devices 28 are in turn operated, according to FIG. 7, to lower the second press plungers 18 against the effective direction of the press force P. As a result, the assemblies 22 including the placed press plungers 16 are also lowered and drop back into the carrier frame 30 or guide frame 32. After the end of the lowering process, the carrier frame 30 with the sintered assemblies 22 received therein can be moved out of the sintering device 10, and a further carrier frame 30 with assemblies 22 to be sintered may be moved in to perform a further sintering operation.

Figure 8:
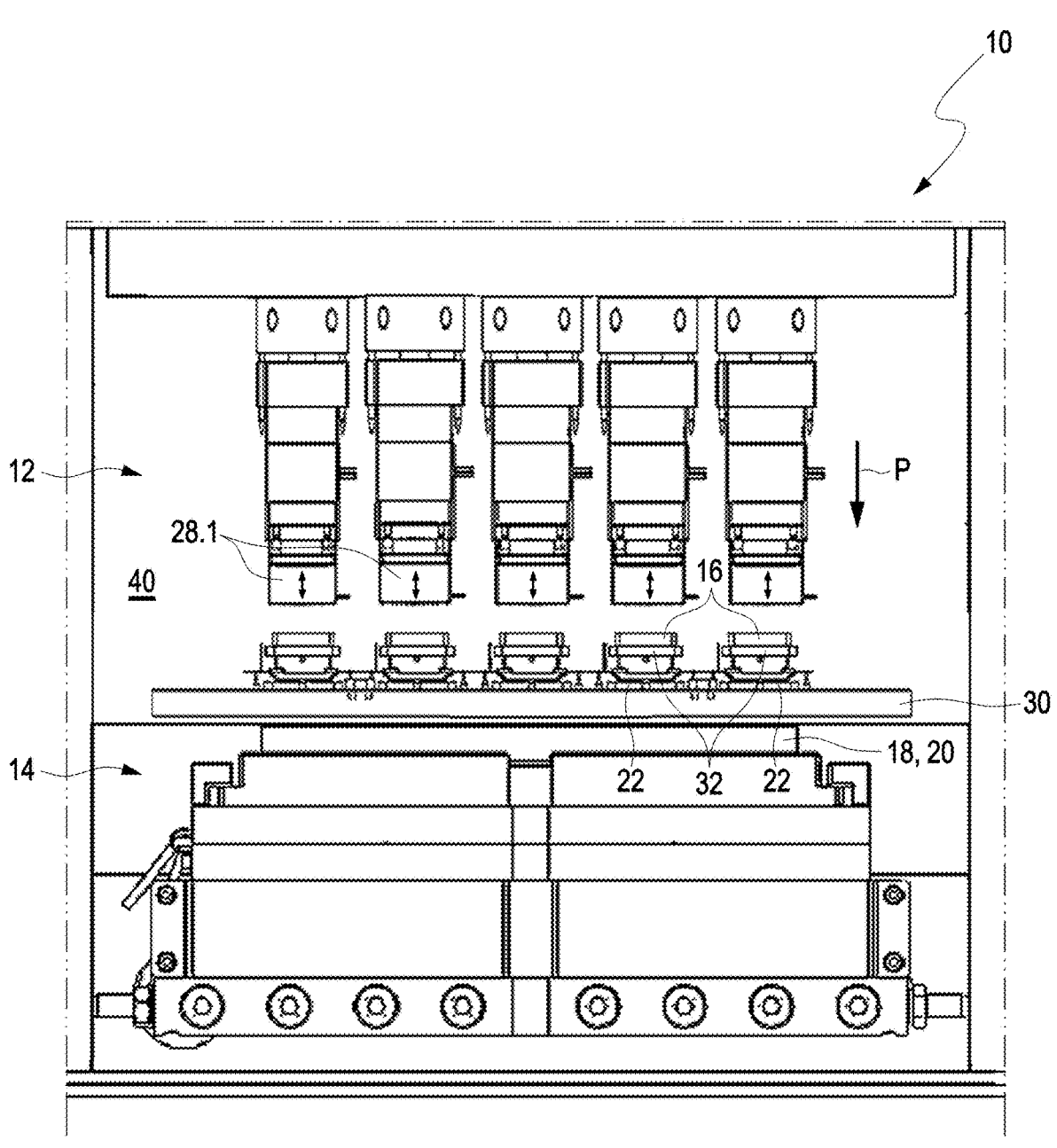
FIG. 8 shows a schematic longitudinal sectional view of a sintering device according to a second example.
Figure 9:
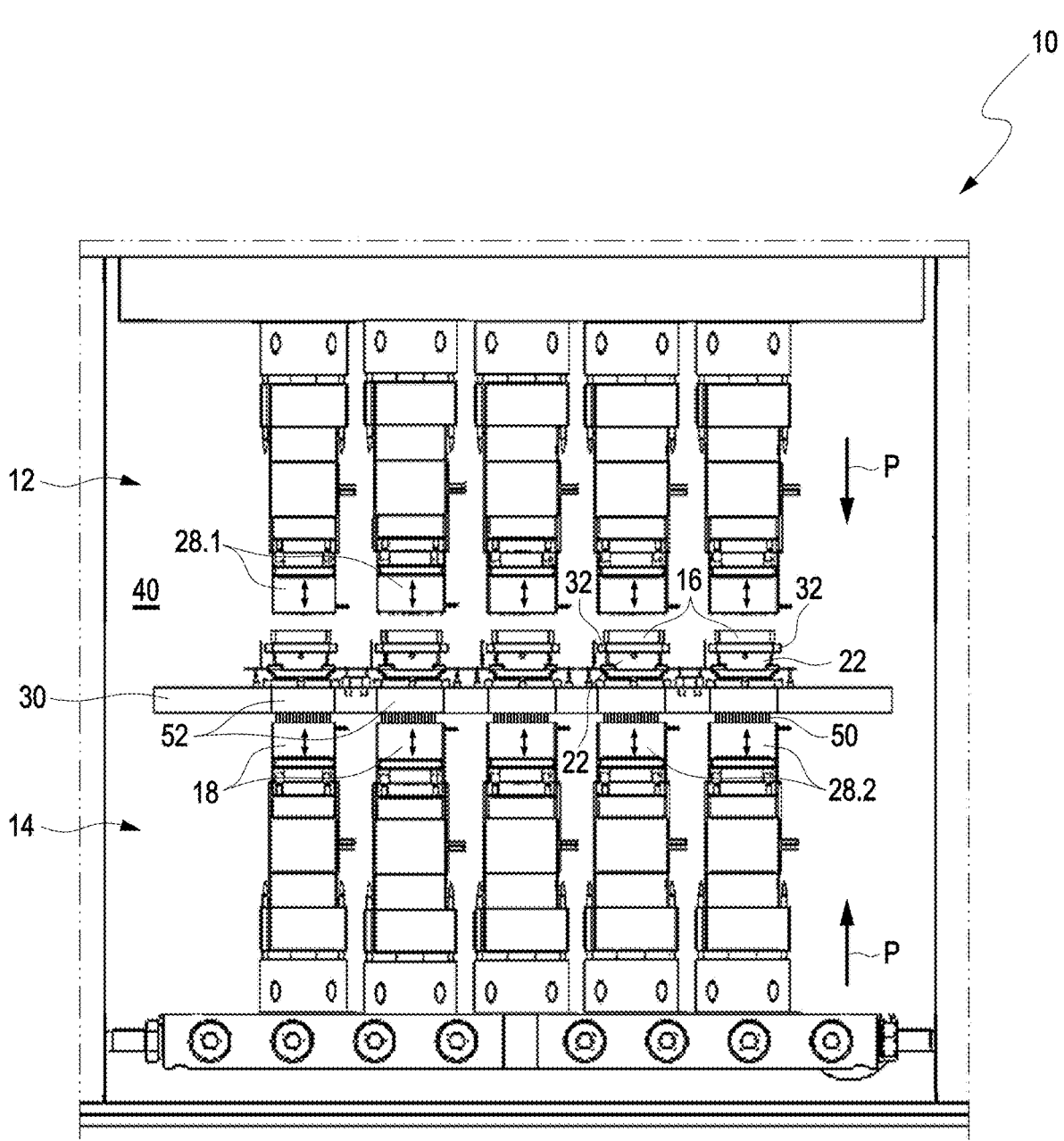
FIG. 9 shows a schematic longitudinal sectional view of a sintering device according to a third example.

The further FIGS. 8 and 9 show alternative second and third embodiments of a sintering device 10, in which a multi-drive comprising several drive devices 28, 28.1, 28.2 is arranged in the upper tool 12, see FIG. 8 relating to the second embodiment, or provided both in the upper tool 12 and in the lower tool 14, see FIG. 9 relating to the third embodiment. Generally speaking, the second and third embodiments of FIGS. 8, 9 are oriented to the design of the first embodiment, described in detail relating to FIGS. 1 to 7. Hence the following is intended to describe only those features that diverge.

The embodiment 10 shown in FIG. 8 differs from the embodiment shown in FIG. 1 in that separate drive devices 28.1 are assigned to each first press plunger 16 and are arranged in the upper tool 12. A pressure plate 20, which acts as the second press plunger 18, is provided in the lower tool. The pressure plate 20 supports the assemblies 22 in the lower tool 14 during the sintering operation. As soon as the carrier frame 30 with assemblies 22 and guide frame 32 with placed first press plungers 16 has been introduced into the working space 40, e.g. transported, in the framework of flow production, by a transport device (not shown), e.g. out of a preheating chamber into a vacuumable process chamber of the sintering device 10, the drive devices 28.1 can contact the upper side of the first press plungers 16 and provide a press force P onto the assemblies 22 with the effective direction towards the lower tool 14. A suitable transport device is known for example from WO 2021/069328 A. The preheating chamber can preferably effect an inductive temperature increase, in particular of the lower part, of the assembly, preferably of a heat sink, and to that extent can comprise conductive induction coils which are a short distance from induction-heatable areas of the assembly and/or of the carrier frame 30.

FIG. 9 shows a third embodiment 10, substantially representing a combination of the embodiments of FIGS. 1 and 8. Whereas according to FIG. 1 the first press plungers 16 of the first embodiment are supported by a pressure plate 20 in the upper tool 12, and in FIG. 8 the second press plunger 18 is designed as a pressure plate 20 in the lower tool 14, the third embodiment of FIG. 9 dispenses with a pressure plate. Several drive devices 28.1, each assigned to a first press plunger 16, are arranged in the upper tool 12. Several drive devices 28.2, each driving the movement of a second press plunger 18, are arranged in the lower tool 14. To do so, the carrier frame 30 has penetrations 52 through which the second press plungers 18 can take effect. The press plungers 18 have springy pin-contact thermo-transfer devices 50 to permit a rapid heat transmission and to compensate for any unevenness and non-parallelism between the surface of the press plungers 18 and the underside of the assemblies 22.

Each assembly 22 is pressed sandwich-like by a drive device 28.1 and a drive device 28.2, wherein temperature, pressure, movement distance etc. are separately settable for each assembly 22. The third embodiment is suitable in particular for parallel sintering of heterogeneous assemblies 22.

The process atmosphere in the sintering device 10 is preferably settable, enabling flushing with a cleaning gas such as formic acid, and oxygen removal, up to a vacuum, is also advantageously possible to prevent oxidation.

REFERENCE NUMERAL LIST

10 Sintering device
12 Upper tool
14 Lower tool
16 First press plunger
18 Second press plunger
20 Pressure plate
22 Assembly
24 Substrate
26 Component
28, 28.1, 28.2 Drive device, drive device of the upper tool, drive device of the lower tool
30 Carrier frame
32 Guide frame
34 Outer frame
36 Inner frame
40 Working space
42 Plunger element
44 Upper plunger element

46 Lower plunger element
48 Contact surface
50 Pin-contact thermo-transfer device
52 Penetrations in carrier frame
P Effective direction of press force

The invention claimed is:

1. A sintering device (10) for simultaneously connecting component parts of several electronic assemblies (22) arranged adjacent to one another by means of pressure sintering, with an upper tool (12) and a lower tool (14), comprising several first press plungers (16) assignable to the upper tool (12), and at least one second press plungers (18) assigned to the lower tool (14), between which the assemblies (22) are received, wherein each of the first press plungers (16) and/or each of the at least one second press plungers (18) is assigned a drive device (28, 28.1, 28.2) configured to exert a press force on one of the assemblies (22) by an axial movement of the assigned first press plunger (16) and/or of the assigned second press plunger (18) along an effective direction of the press force (P), wherein the first press plungers (16) are placed onto the assemblies (22) before the start of the pressing operation, and press the assemblies (22) against the at least one second press plunger (18) during the application of the press force.

2. The sintering device (10) according to claim 1, wherein the first press plungers (16) are braced against a pressure plate (20) of the upper tool (14), wherein the at least one drive device (28, 28.2) of the lower tool (14) applies the press force (P) in an effective direction via the at least one second press plunger (18) in the direction of the upper tool (12), or that the at least one second press plunger (18) is braced against a pressure plate (20) of the lower tool (14) or is formed from said plate, wherein the at least one drive device (28, 28.1) of the upper tool (12) applies the press force (P) in the effective direction of the lower tool (14).

3. The sintering device (10) according to claim 1, wherein a drive device (28, 28.1) of the upper tool (12) is assigned to the several first press plungers (16) and a drive device (28, 28.2) of the lower tool (14) to the several second press plungers (18), wherein each electronic assembly (22) is subjectable on both sides to the drive devices (28, 28.1, 28.2) of the upper tool (12) and of the lower tool (14) due to opposing effective directions of the press forces (P).

4. The sintering device (10) according to claim 1, wherein each drive device (28, 28.1, 28.2) is controllable individually in respect of a movement distance and/or an exerted press force (P), hydraulically, by electric motor, piezoelectrically or magnetostrictively.

5. The sintering device (10) according to claim 1, wherein each of the second press plungers (18) is connected to the assigned drive device (28, 28.2) and/or has a respective heating and/or cooling device.

6. The sintering device (10) according to claim 1, wherein a carrier frame (30) insertable into the sintering device (10) is provided, in which at least the component parts of the assemblies (22), together with the placed first press plungers, are held in guided manner in the lateral direction, wherein the carrier frame (30) has penetrations (52), assigned to the assemblies (22), through which the second press plungers (18) can come into mechanical and thermal contact with the assemblies (22, wherein the carrier frame (30) has a higher thermal expansion coefficient than an upper part of the assemblies (22).

7. The sintering device (10) according to claim 6, wherein at least one guide frame (32) is detachably arranged on the carrier frame (30), and is configured to guide the first press plungers (16) in the lateral direction relative to the assemblies (22).

8. The sintering device (10) according to claim 1, wherein each of the first and/or second press plungers (18) has a plunger element (42), axially movable along an effective direction of the press force (P), and a contact surface (48) contactable with a component part of the assembly (22), wherein the contact surface (48) is mounted tiltably about at least one spatial axis relative to the plunger element (42).

9. The sintering device (10) according to claim 1, wherein several first press plungers (16) arranged adjacent to another are assigned to a respective second press plunger (18), or several second press plungers (18) arranged adjacent to another are assigned to a respective first press plunger (16).

10. A method for simultaneously connecting component parts of several electronic assemblies (22) arranged adjacent to one another by means of pressure sintering in a sintering device (10) according to claim 1, wherein the sintering device (10) comprises several first press plungers (16) and at least one second press plungers (18), between which the assemblies (22) are received, and wherein each of the first press plungers (16) and/or the at least second press plunger (18) is movable for exerting a press force onto one of the assemblies (22) by means of an assigned drive device (28, 28.1, 28.2) axially along an effective direction of the press force (P), with the steps placing the first press plungers (16) onto the assemblies (22), inserting the assemblies (22) together with the first press plungers into the sintering device (10), into a position aligned with the second press plunger(s) (18), performing the sintering operation by means of actuating the drive devices (28, 28.1, 28.2), in order to move the first press plungers (16) and/or the at least second press plunger (18), in order to generate the pressure, from a rest position into a working position in which the assemblies (22) are jointly pressed between the first press plungers (18) and the at least second press plunger (18) which is arranged opposite the first press plungers (16) for application of a counterforce.

11. The method according to claim 10, wherein at least the step of performing the sintering operation comprises heating and/or cooling of the first press plunger (16) and/or of the at least second press plunger (18), wherein the first press plunger (16) maintains a lower temperature level than the second press plunger (18).

12. The method according to claim 10, wherein the drive devices (28, 28.1, 28.2) for movement of the first press plungers (16) and/or the second press plungers (18) into the working position are actuated with a time delay.

13. The method according to claim 12, wherein the drive devices (28, 28.1, 28.2) are actuated with a time delay such that initially at least one drive device (28, 28.1, 28.2) arranged in a central area is actuated and drive devices (28, 28.1, 28.2) further outwards are actuated after a time interval.

\* \* \* \* \*